United States Patent
Chan

(10) Patent No.: US 10,181,787 B2
(45) Date of Patent: Jan. 15, 2019

(54) POWER FACTOR CORRECTION DEVICE, AND CURRENT SENSING METHOD AND APPARATUS THEREOF

(71) Applicant: Murata Manufacturing Co., Ltd., Nagaokakyo-shi, Kyoto-fu (JP)

(72) Inventor: Chuk Hung Chan, Hong Kong (CN)

(73) Assignee: MURATA MANUFACTURING CO., LTD., Kyoto (JP)

(*) Notice: Subject to any disclaimer, the term of this patent is extended or adjusted under 35 U.S.C. 154(b) by 0 days.

(21) Appl. No.: 15/921,702

(22) Filed: Mar. 15, 2018

(65) Prior Publication Data

US 2018/0287488 A1 Oct. 4, 2018

(30) Foreign Application Priority Data

Mar. 29, 2017 (CN) .......................... 2017 1 0201579

(51) Int. Cl.
*H02M 1/42* (2007.01)
*G01R 19/10* (2006.01)
*H02M 1/00* (2006.01)

(52) U.S. Cl.
CPC .......... *H02M 1/4208* (2013.01); *G01R 19/10* (2013.01); *H02M 2001/0009* (2013.01)

(58) Field of Classification Search
CPC ........ H02M 1/12; H02M 1/14; H02M 1/4208; H02M 1/4266; H02M 1/143; H02M 1/15; H02M 1/126; H02M 3/156
See application file for complete search history.

(56) References Cited

U.S. PATENT DOCUMENTS

| | | | | |
|---|---|---|---|---|
| 5,600,549 A | * | 2/1997 | Cross | H02M 1/4208 323/285 |
| 2010/0073090 A1 | | 3/2010 | Mattos | |
| 2011/0096576 A1 | * | 4/2011 | Takahashi | H02M 1/4225 363/44 |
| 2011/0216558 A1 | * | 9/2011 | Uno | H02M 1/4225 363/21.12 |
| 2014/0097808 A1 | * | 4/2014 | Clark | G05F 1/70 323/208 |
| 2015/0372588 A1 | * | 12/2015 | Jiang | H02M 1/4225 323/210 |
| 2017/0187279 A1 | * | 6/2017 | Oe | H02M 1/42 |

* cited by examiner

*Primary Examiner* — Adolf Berhane
(74) *Attorney, Agent, or Firm* — Keating & Bennett, LLP

(57) ABSTRACT

A PFC device includes at least one main switch, a converter that converts a current to be sensed in the PFC device into a voltage to be sensed, the PFC device generating a switch control signal to control the at least one main switch based on the current to be sensed, and a voltage sensor that receives the voltage to be sensed and an offset voltage, and senses the voltage to be sensed using the offset voltage to output a sense voltage. A method includes sampling the sense voltage, determining a sense value of the offset voltage based on a sampling result, and calculating the current to be sensed based on a difference between the sense voltage and the sense value.

19 Claims, 8 Drawing Sheets

POWER FACTOR CORRECTION DEVICE, AND CURRENT SENSING METHOD AND APPARATUS THEREOF

CROSS REFERENCE TO RELATED APPLICATIONS

This application claims the benefit of priority to Chinese Patent Application No. 201710201579.1 filed on Mar. 29, 2017. The entire contents of this application are hereby incorporated herein by reference.

BACKGROUND OF THE INVENTION

1. Field of the Invention

The present invention relates to power factor correction (PFC) technology, and more particularly, to a PFC device, and a current sensing method and apparatus thereof.

2. Description of the Related Art

Power factor (PF) is a parameter used for measuring power consumption efficiency of electrical equipment. To improve the power consumption efficiency, PFC is usually performed to an alternating current (AC) input signal before the AC input signal is supplied to the electrical equipment. A PFC device usually increases PF by reducing a phase difference between a voltage and a current. Generally, the PFC device may include at least one main switch (also referred to as a power switch), and may further include an inductor and a rectifier. The PFC device needs to sense a current in the PFC device during power factor correction. The current to be sensed may be an inductor current flowing through the inductor. The PFC device may generate a switch control signal for controlling the at least one main switch according to the current to be sensed, so as to control the at least one main switch to change a switch status.

The PFC device may convert the current to be sensed in the PFC device into a voltage to be sensed by using a conversion unit (for example, including a sense resistor) and sense the voltage to be sensed with a voltage sensing unit. The voltage to be sensed can reflect a magnitude of the current to be sensed. In practice, the voltage sensing unit may include a differential operational amplifier circuit for appropriately signal-conditioning the voltage to be sensed and an analog-to-digital converter (ADC) for sampling the voltage to be sensed. The PFC device may further include a digital signal controller (DSC) which is configured to calculate the current to be sensed in the PFC device based on a data acquisition result and determine a time point for controlling the at least one main switch to change the switch status based on the current to be sensed, so that an alternating current (AC) input current of the PFC device follows a sinusoidal waveform of its AC input voltage.

Generally, circuits sensitive to accuracy (such as active crystal oscillator, phase-locked loop and etc.) are powered by a single power supply, that is, a negative power supply port is grounded. The inductor current in the PFC device generally rises from 0 A and then drops, and the voltage to be sensed also rises from 0V and then drops. When a negative power supply port of an operational amplifier of the differential operational amplifier circuit is grounded, an amplitude of an output signal of the differential operational amplifier circuit may be close to 0V, which causes large distortion of the output signal. To solve the technical problem, an offset voltage is usually provided at an input of the differential operational amplifier circuit. The offset voltage may be generated by a constant voltage source to boost an amplitude of a sense voltage output from an output of the differential operational amplifier circuit. The amplitude of the sense voltage is much higher than a ground voltage (i.e., 0V) to avoid signal distortion. FIG. 1 schematically illustrates a waveform of a sense voltage Vsense sensed when an offset voltage Voffset is provided ideally, and it also reflects a waveform of the current to be sensed. After ADC sampling, DSC subtracts the offset voltage Voffset from the data acquisition result, and then calculates the current to be sensed in the PFC device accordingly.

In an existing technique, US 2010/0073090 A1 discloses a current sense amplifier whose circuit structure is shown in FIG. 2. Referring to FIG. 2, the current sense amplifier 100 may include two cascaded stages of the first stage 101 and the second stage 102 to sense a sense current Isense consumed by a load circuit 103 to output a sense voltage Vout. The first stage 101 may include an operational amplifier 104, a transistor MP1, resistors R1 and R2, and a first offset voltage source 105. The sense current Isense is converted into a voltage signal by a conversion resistor Rsense and connected to two input terminals of the operational amplifier 104. A first offset voltage (not shown) generated by the first offset voltage source 105 is connected to one of the inputs of the operational amplifier 104. The second stage 102 may include an operational amplifier 106, a second offset voltage source 107, a bandwidth compensation circuit 108, resistors R3 and R4, and a bypass circuit 109. In a scaling up circuit of the second stage 102, a second offset voltage (not shown) generated by the second offset voltage source 107 and the first offset voltage are used for boosting an amplitude of signals output from the corresponding operational amplifiers respectively, to prevent signal distortion and provide convenience for measurement. In practice, the offset voltage is generally provided by a constant voltage source. When the sense current Isense is calculated based on the sense voltage Vout, the offset voltage (i.e., a nominal voltage of the constant voltage source) needs to be subtracted. However, aging of the constant voltage source, thermal effect and other factors make an actual output voltage value not match its nominal voltage, for example, the nominal voltage is 12V, and the actual output voltage is 12.5V or fluctuates around 12V. Even worse, this error effect accumulates in the circuit, which makes the sensing of the sense current Isense more and more inaccurate.

Thus, in the PFC device, as the actual value of the offset voltage does not match its nominal value, current sensing accuracy of the PFC device may be seriously affected.

SUMMARY OF THE INVENTION

Preferred embodiments of the present invention provide PFC devices with improved current sensing accuracy.

In a preferred embodiment of the present invention, a current sensing method for a PFC device is provided, wherein the PFC device includes at least one main switch; a converter that converts a current to be sensed in the PFC device into a voltage to be sensed, the PFC device that generates a switch control signal to control the at least one main switch based on the current to be sensed; and a voltage sensor that receives the voltage to be sensed and an offset voltage, and sense the voltage to be sensed using the offset voltage to output a sense voltage, and wherein the method includes sampling the sense voltage; determining a sense value of the offset voltage based on a sampling result; and calculating the current to be sensed based on a difference between the sense voltage and the sense value of the offset voltage.

In a preferred embodiment of the present invention, determining a sense value of the offset voltage based on a sampling result may include determining a minimum sampling voltage based on a plurality of sampling voltages obtained by the sampling in each predetermined time period, the minimum sampling voltage being a minimum value among the plurality of sampling voltages; and determining the minimum sampling voltage as the sense value of the offset voltage.

In a preferred embodiment of the present invention, the method may further include prior to sampling the sense voltage, initializing the minimum sampling voltage to a maximum error offset voltage, wherein the maximum error offset voltage is a maximum value of the offset voltage within a predetermined error range, wherein determining a minimum sampling voltage based on a plurality of sampling voltages obtained by the sampling may include comparing the plurality of sampling voltages with the maximum error offset voltage; and determining a minimum value among the plurality of sampling voltages and the maximum error offset voltage as the minimum sampling voltage.

In a preferred embodiment of the present invention, the method may further include when the predetermined time period ends, resetting the minimum sampling voltage to the maximum error offset voltage.

In a preferred embodiment of the present invention, the predetermined time period may be determined based on a sampling rate at which the sense voltage is sampled and a frequency of an alternating current (AC) input signal input to the PFC device.

In a preferred embodiment of the present invention, the PFC device may further include an inductor and a rectifier, wherein the inductor is directly or indirectly coupled with the at least one main switch and the rectifier, and the current to be sensed is an inductor current flowing through the inductor.

In a preferred embodiment of the present invention, the rectifier may include a rectifier bridge which includes a first bridge arm, a second bridge arm, a third bridge arm and a fourth bridge arm, an AC input signal being provided between a first input terminal and a second input terminal of the rectifier bridge, and the rectifier bridge rectifies the AC input signal, wherein a first terminal of the inductor is directly or indirectly coupled with a first output terminal of the rectifier bridge, a second terminal of the inductor is directly or indirectly coupled with a first terminal of the at least one main switch, and a second terminal of the at least one main switch is directly or indirectly coupled with a second output terminal of the rectifier bridge, and the converter is disposed at one of the following positions: between the first terminal of the inductor and the first output terminal of the rectifier bridge, between the second terminal of the inductor and the first terminal of the at least one main switch, between the second output terminal of the rectifier bridge and the second terminal of the at least one main switch, or in the first, second, third or fourth bridge arm.

In a preferred embodiment of the present invention, the converter may include a conversion resistor, wherein the current to be sensed is a current flowing through the conversion resistor, and the voltage to be sensed is a voltage across the conversion resistor.

In a preferred embodiment of the present invention, the voltage sensor may include an operational amplifier, a first resistor, a second resistor, a third resistor, and a feedback resistor, wherein a first input terminal of the operational amplifier is coupled to a first terminal of the conversion resistor via the first resistor, a second input terminal of the operational amplifier is coupled to a second terminal of the conversion resistor via the second resistor, the second input terminal of the operational amplifier is grounded via the third resistor, two terminals of the third resistor receive the offset voltage, the first input terminal of the operational amplifier is coupled to an output terminal of the operational amplifier via the feedback resistor, and the output terminal of the operational amplifier outputs the sense voltage.

In a preferred embodiment of the present invention, a current sensing apparatus for a PFC device is provided, wherein the PFC device includes at least one main switch; a converter that converts a current to be sensed in the PFC device into a voltage to be sensed, the PFC device that generates a switch control signal to control the at least one main switch based on the current to be sensed; and a voltage sensor that receives the voltage to be sensed and an offset voltage, and senses the voltage to be sensed using the offset voltage to output a sense voltage, and wherein the apparatus includes a voltage sampling circuitry that samples the sense voltage; an offset voltage determining circuitry that determines a sense value of the offset voltage based on a sampling result; and a current calculating circuitry that calculates the current to be sensed based on a difference between the sense voltage and the sense value of the offset voltage.

In a preferred embodiment of the present invention, the offset voltage determining circuitry may include a minimum sampling voltage determining sub-circuitry that determines a minimum sampling voltage based on a plurality of sampling voltages obtained by the sampling in each predetermined time period, the minimum sampling voltage being a minimum value among the plurality of sampling voltages; and an offset voltage determining sub-circuitry that determines the minimum sampling voltage as the sense value of the offset voltage.

In a preferred embodiment of the present invention, the apparatus may further include an initializing circuitry that, before the voltage sampling circuitry samples the sense voltage, initializes the minimum sampling voltage to a maximum error offset voltage, wherein the maximum error offset voltage is a maximum value of the offset voltage within a predetermined error range, wherein the minimum sampling voltage determining sub-circuitry includes a voltage comparing sub-circuitry coupled with the initializing circuitry and that compares the plurality of sampling voltages with the maximum error offset voltage, and determines a minimum value among the plurality of sampling voltages and the maximum error offset voltage as the minimum sampling voltage.

In a preferred embodiment of the present invention, the apparatus may further include a voltage resetting circuitry coupled with the initializing circuitry and that, when the predetermined time period ends, resets the minimum sampling voltage to the maximum error offset voltage.

In a preferred embodiment of the present invention, the predetermined time period may be determined based on a sampling rate at which the sense voltage is sampled and a frequency of an AC input signal input to the PFC device.

In a preferred embodiment of the present invention, the PFC device may further include an inductor and a rectifier, wherein the inductor is directly or indirectly coupled with the at least one main switch and the rectifier, and the current to be sensed is an inductor current flowing through the inductor.

In a preferred embodiment of the present invention, the rectifier may include a rectifier bridge which includes a first bridge arm, a second bridge arm, a third bridge arm and a fourth bridge arm, an AC input signal being provided between a first input terminal and a second input terminal of the rectifier bridge, and the rectifier bridge rectifies the AC input signal, wherein a first terminal of the inductor is directly or indirectly coupled with a first output terminal of the rectifier bridge, a second terminal of the inductor is directly or indirectly coupled with a first terminal of the at least one main switch, and a second terminal of the at least one main switch is directly or indirectly coupled with a second output terminal of the rectifier bridge, and the converter is disposed at one of the following positions: between the first terminal of the inductor and the first output terminal of the rectifier bridge, between the second terminal of the inductor and the first terminal of the at least one main switch, between the second output terminal of the rectifier bridge and the second terminal of the at least one main switch, or in the first, second, third or fourth bridge arm.

In a preferred embodiment of the present invention, the converter may include a conversion resistor, wherein the current to be sensed is a current flowing through the conversion resistor, and the voltage to be sensed is a voltage across the conversion resistor.

In a preferred embodiment of the present invention, the voltage sensor may include an operational amplifier, a first resistor, a second resistor, a third resistor and a feedback resistor, wherein a first input terminal of the operational amplifier is coupled to a first terminal of the conversion resistor via the first resistor, a second input terminal of the operational amplifier is coupled to a second terminal of the conversion resistor via the second resistor, the second input terminal of the operational amplifier is grounded via the third resistor, two terminals of the third resistor receive the offset voltage, the first input terminal of the operational amplifier is coupled to an output terminal of the operational amplifier via the feedback resistor, and the output terminal of the operational amplifier outputs the sense voltage.

In a preferred embodiment of the present invention, a PFC device is provided, including at least one main switch, a converter, a voltage sensor and a current sensing apparatus.

Preferred embodiments of the present disclosure provide the following advantages. PFC devices provided in preferred embodiments of the present invention may include at least one main switch, a converter, and a voltage sensor. The converter converts a current to be sensed in the PFC device into a voltage to be sensed. The PFC device generates a switch control signal to control the at least one main switch based on the current to be sensed. The voltage sensor receives the voltage to be sensed and an offset voltage, and uses the offset voltage to sense the voltage to be sensed to output a sense voltage. In preferred embodiments of the present invention, the sense voltage is sampled, a sense value of the offset voltage is determined based on a sampling result, and the current to be sensed is calculated based on a difference between the sense voltage and the sense value of the offset voltage. As the sense value obtained by sampling the offset voltage is used to calculate the current to be sensed, and the sense value is obtained by actual measurement, even if factors, such as aging of a constant voltage source generating the offset voltage or a thermal effect, make an actual output voltage value not match its nominal voltage value, it does not affect sensing accuracy of the current to be sensed. Compared with existing techniques, preferred embodiments of the present invention effectively improve current sensing accuracy of the PFC device.

Further, in a preferred embodiment of the present invention, a minimum sampling voltage is determined based on a plurality of sampling voltages obtained by the sampling in each predetermined time period, the minimum sampling voltage being a minimum value among the plurality of sampling voltages; and the minimum sampling voltage is determined as the sense value of the offset voltage. As the sense value of the offset voltage to calculate the current to be sensed is updated every time the predetermined time period elapses, variation of the offset voltage is monitored in real time, which is more advantageous to improve the current sensing accuracy.

Further, prior to sampling the sense voltage, a method according to a preferred embodiment of the present invention may further include initializing the minimum sampling voltage to a maximum error offset voltage, wherein the maximum error offset voltage is a maximum value of the offset voltage within a predetermined error range, and determining a minimum sampling voltage based on a plurality of sampling voltages obtained by the sampling may include comparing the plurality of sampling voltages with the maximum error offset voltage; and determining a minimum value among the plurality of sampling voltages and the maximum error offset voltage as the minimum sampling voltage. If an anomaly occurs during the sampling of the sense voltage and makes the sampling result rather larger and larger than the maximum error offset voltage, the maximum error offset voltage may be directly used as the sense value of the offset voltage. The solution may ensure the accuracy of the current sensing of the PFC device when an anomaly occurs.

Further, a PFC device according to a preferred embodiment of the present invention may further include an inductor and a rectifier, wherein the inductor is directly or indirectly coupled with the at least one main switch and the rectifier, and the current to be sensed is an inductor current flowing through the inductor, which makes the current sensing method be capable of being applied to a wide range of PFC devices and universally applicable.

Further, a position of the converter in PFC devices in preferred embodiments of the present invention may be one of various positions. Specifically, the converter may be disposed at one of the following positions: between the first terminal of the inductor and the first output terminal of the rectifier bridge, between the second terminal of the inductor and the first terminal of the at least one main switch, between the second output terminal of the rectifier bridge and the second terminal of the at least one main switch, or in the first, second, third or fourth bridge arm, which makes solutions of the preferred embodiments of the present invention easy to implement and universally applicable.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

As described in the background, in the existing techniques, during the calculation of the current to be sensed in the PFC device using the offset voltage, the nominal voltage value of the constant voltage source to generate the offset voltage is used to calculate the current to be sensed. When objective factors, such as aging or thermal effects, act on the constant voltage source, the actual value of the offset voltage does not match the nominal value, which seriously affects the current sensing accuracy of the PFC device.

The inventor of preferred embodiments of the present invention analyzed the current sensing methods for PFC devices in the existing techniques.

Figure 1:
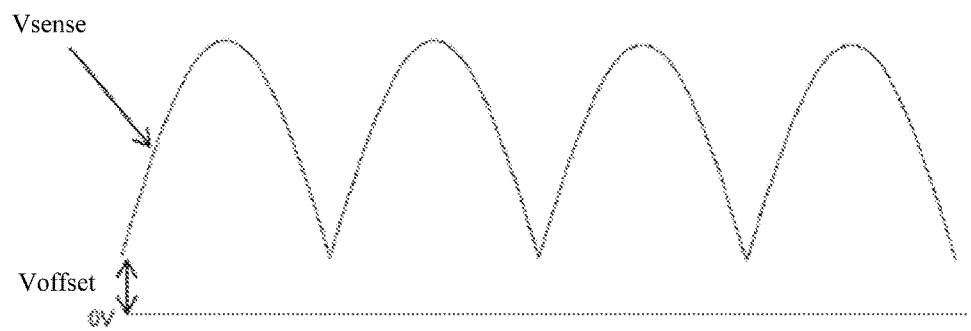
FIG. 1 schematically illustrates a waveform diagram of a sense voltage in a PFC device in existing techniques.
Figure 2:
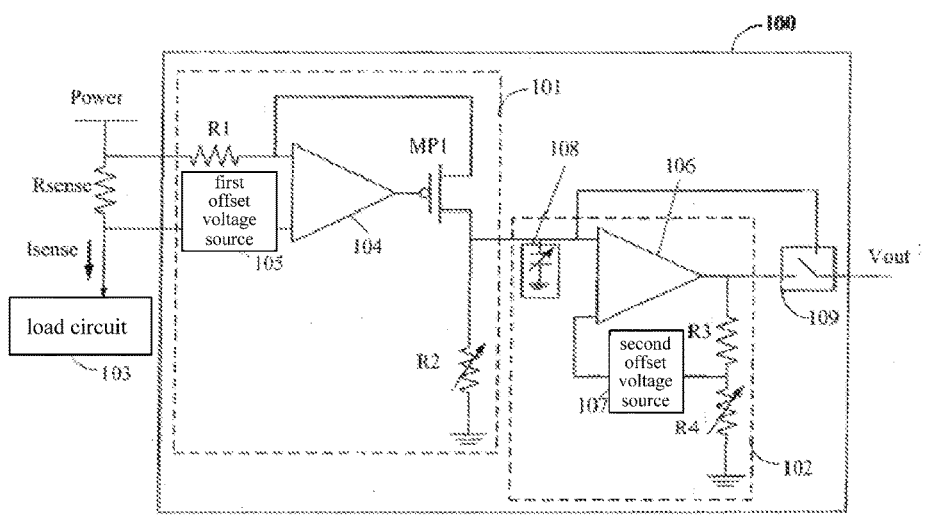
FIG. 2 schematically illustrates a circuit structural diagram of a current sensing amplifier in the existing techniques.
Figure 3:
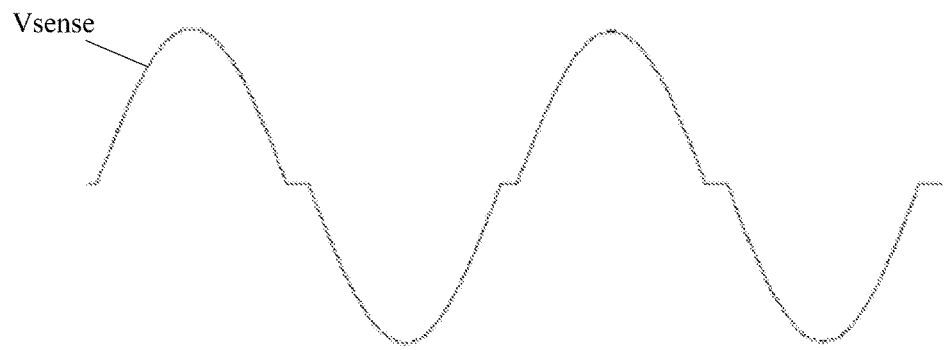
FIG. 3 schematically illustrates a waveform diagram of a sense voltage obtained when an offset voltage is too high.
Figure 4:
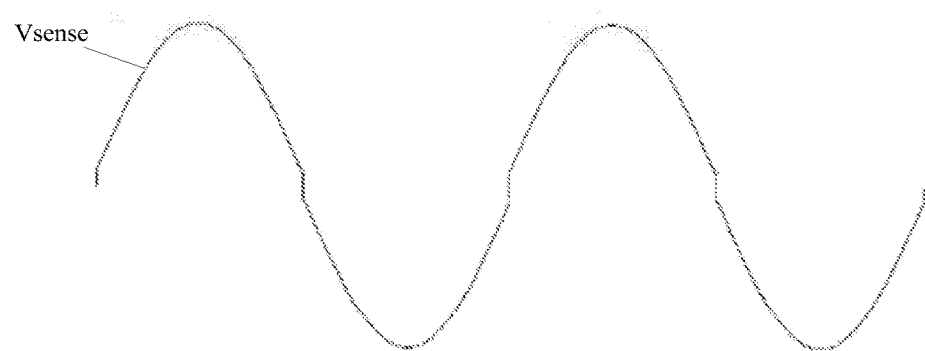
FIG. 4 schematically illustrates a waveform diagram of a sense voltage obtained when an offset voltage is too low.

First, the inventor discovered that, as shown in FIGS. 3 and 4, when the offset voltage Voffset is too high, that is, the actual value of the offset voltage Voffset is higher than its nominal value, the current Isense to be sensed which is obtained in the PFC device has a distortion, and similarly, when the offset voltage Voffset is too low, that is, the actual value of the offset voltage Voffset is lower than its nominal value, the current Isense to be sensed which is obtained in the PFC device also has a distortion. The distortion directly indicates that the current Isense to be sensed has a current high total harmonic distortion (THD), causing a sensing result of the current Isense to be sensed to have an error and reducing the sensing accuracy. This may further affect accuracy of a power factor of the PFC device.

Second, the inventor also discovered that there is a significant floating of the offset voltage between a minimum load and a maximum load of the PFC device. Moreover, although it may be calibrated during the generation of the offset voltage, the calibration process is inconvenient for an assembled PFC device. Further, the calibration also cannot eliminate the aging and variations of the offset voltage with changes of load situations of the PFC device.

Therefore, the accuracy of the offset voltage is important as it affects the current sensing accuracy in PFC devices.

Preferred embodiments of the present invention provide current sensing methods for PFC devices. By using the sense value obtained by sampling the offset voltage to calculate the current to be sensed, it is possible to avoid a situation of the actual output voltage value not matching the nominal voltage value which is caused by factors, such as the aging of the constant voltage source generating the offset voltage or a thermal effect. Accordingly, an impact on the sensing accuracy of the current to be sensed is reduced or prevented.

In order to clarify the solutions and advantages of preferred embodiments of the present invention, preferred embodiments of present disclosure will be described clearly in detail in conjunction with accompanying drawings.

Figure 5:
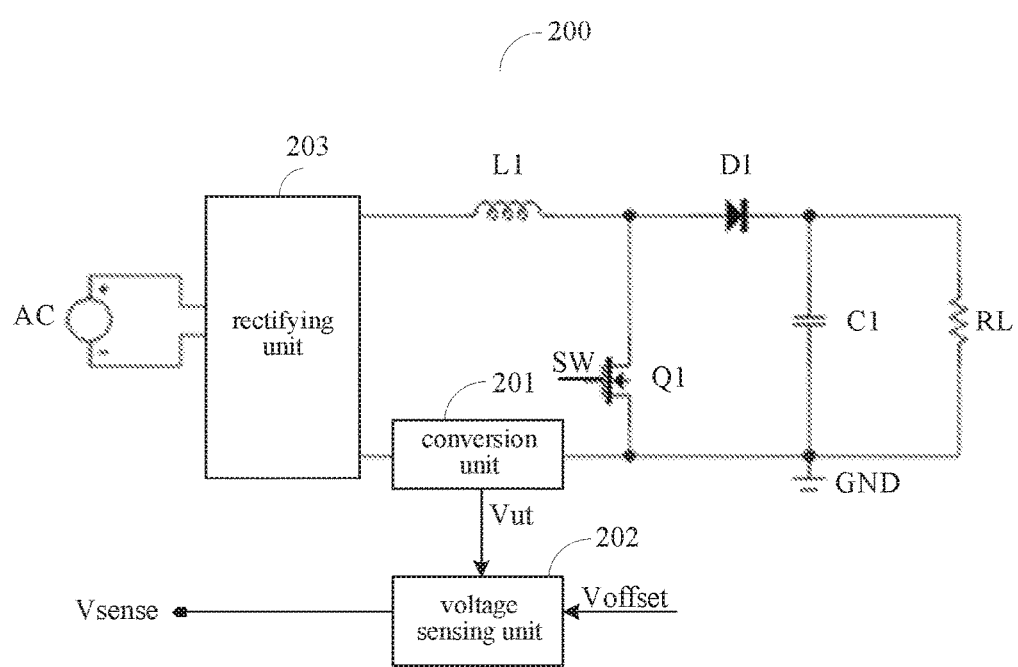
FIG. 5 schematically illustrates a circuit structural diagram of a PFC device according to a preferred embodiment of the present invention.

FIG. 5 schematically illustrates a circuit structural diagram of a PFC device according to a preferred embodiment of the present invention.

Referring to FIG. 5, a PFC device 200 includes at least one main switch, a converter 201 and a voltage sensor 202. The main switch in the present preferred embodiment refers to a switching transistor or other switching device, in which a magnitude of an AC input current in the PFC device is controlled by frequently turning on and off the main switch. It should be understood by those skilled in the art that in the PFC device, the number of main switches (also called power switches) is not limited. Therefore, the PFC device 200 shown in FIG. 5 merely includes one main switch as an example, and only the main switch Q1 is used to represent the at least one main switch in the following description. The present disclosure is not limited thereto.

The converter 201 converts the current to be sensed (not shown) in the PFC device 200 into a voltage Vut to be sensed, so as to convert a sensing mode of signals. The voltage sensor 202 receives the voltage Vut to be sensed and the offset voltage Voffset. The voltage sensor 202 senses the voltage Vut to be sensed using the offset voltage Voffset to output the sense voltage Vsense. The offset voltage Voffset may preferably be generated by a constant voltage source (not shown), for example.

The PFC device 200 is preferably powered by a single power supply. The introduction of the offset voltage Voffset allows the voltage Vut to be sensed to generate, based on the original voltage reference, an offset with a magnitude equal or substantially equal to that of the offset voltage Voffset, so as to prevent the sense voltage Vsense output by the voltage sensor 202 from being distorted. The voltage sensor 202 may amplify the voltage Vut to be sensed.

The PFC device 200 generates a switch control signal (corresponding to the main switch Q1 and indicated by SW) to control the at least one main switch (i.e., the main switch Q1) based on the current to be sensed. Specifically, the PFC device may preferably include a DSC that subtracts the offset voltage Voffset from a data acquisition result output by the ADC after the ADC sampling, calculates the current to be sensed based on the subtraction result, and determines the timing to control the at least one main switch (i.e., the main switch Q1) to change a switching status based on a magnitude of the current to be sensed, where the timing is reflected in the switch control signal SW, so that the AC input current of the PFC device 200 has a sinusoidal waveform of its AC input voltage, to achieve PFC of the AC input signal AC input to the PFC device 200.

Further, the PFC device 200 may preferably further include an inductor L1 and a rectifier 203, wherein the inductor L1 is a power storage inductor which is directly or indirectly coupled with the at least one main switch (i.e., the main switch Q1) and the rectifier 203. The current to be sensed may be an inductor current (not shown) flowing through the inductor L1. The PFC device 200 may preferably further include a freewheeling diode D1 and a capacitor C1. Taking a positive half cycle of the AC input signal AC as an example, the rectifier 203 rectifies the AC input signal AC, and a rectified output signal may be transmitted to the inductor L1. The switch control signal SW controls the main switch Q1 to be turned on, and the main switch Q1, the converter 201 and the rectifier 203 define an electric loop, wherein the inductor L1 stores power and the inductor current increases sharply. When it is sensed that the magnitude of the inductor current increases above a requirement of power factor correction, the switch control signal SW controls the main switch Q1 to turn off. The inductor current is transmitted to a capacitor C1 and a load resistor RL via the freewheeling diode D1. The inductor current drops under consumption of the load resistor RL. When it is sensed that the magnitude of the inductor current drops below the requirement of power factor correction, the switch control signal SW controls the main switch Q1 to be turned on, and the above process is repeated. Accordingly, an operating mechanism during a negative half cycle of the AC input signal AC is similar.

Figure 6:
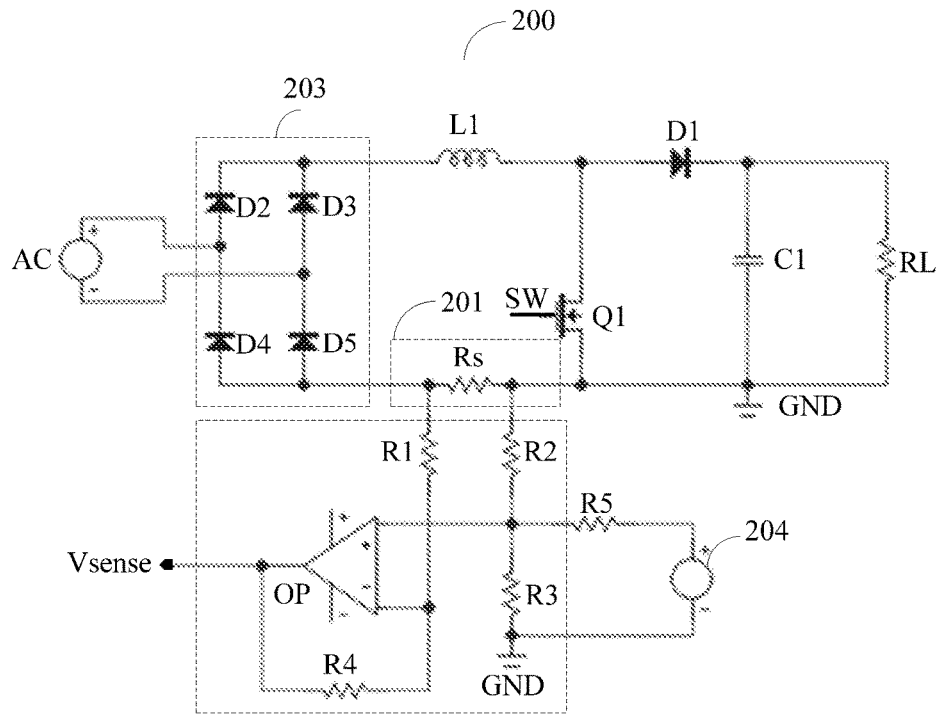
FIG. 6 schematically illustrates a circuit diagram of a PFC device according to a preferred embodiment of the present invention.

FIG. 6 schematically illustrates a circuit diagram of a PFC device according to a preferred embodiment of the present invention.

Referring to FIGS. 5 and 6, the rectifier 203 in the present preferred embodiment may preferably include a rectifier bridge (not shown in the figures). The rectifier bridge includes a first bridge arm (referring to a second diode D2), a second bridge arm (referring to a third diode D3), a third bridge arm (referring to a fourth diode D4) and a fourth bridge arm (referring to a fifth diode D5), and the first to the fourth bridge arm are sequentially coupled. An anode of the second diode D2 is coupled with a cathode of the fourth diode D4 and a first input terminal of the rectifier bridge, and an anode of the third diode D3 is coupled with a cathode of the fifth diode D5 and a second input terminal of the rectifier bridge, a cathode of the second diode D2 is coupled with a cathode of the third diode D3 and a first output terminal of the rectifier bridge, and an anode of the fourth diode D4 is coupled with an anode of the fifth diode D5 and a second output terminal of the rectifier bridge. The AC input signal AC is provided between the first input terminal and the second input terminal of the rectifier bridge, and the rectifier bridge rectifies the AC input signal AC.

A first terminal of the inductor L1 is directly or indirectly coupled with the first output terminal of the rectifier bridge, and a second terminal of the inductor L1 is directly or indirectly coupled with a first terminal (e.g., the source) of the at least one main switch (i.e., the main switch Q1), a second terminal (e.g., a drain) of the at least one main switch (i.e., the main switch Q1) is directly or indirectly coupled with the second output terminal of the rectifier bridge.

Further, in the present preferred embodiment, the position of the converter 201 in the PFC device 200 may be changed, so that the solutions are easy to implement and universally applicable.

Specifically, the converter 201 may be disposed in one of the following positions: between the first terminal of the inductor L1 and the first output terminal of the rectifier bridge, between the second terminal of the inductor L1 and the first terminal of the at least one main switch (i.e., the main switch Q1), or between the second output terminal of the rectifier bridge and the second terminal of the at least one main switch (i.e., the main switch Q1), so that the current to be sensed is the inductor current, and a corresponding waveform of the sense voltage Vsense is a full-wave rectification waveform.

In a preferred embodiment of the present invention, the converter 201 may be disposed in the first bridge arm, the second bridge arm, the third bridge arm, or the fourth bridge arm. Although the waveform of the sense voltage Vsense obtained at this time is preferably a half-wave rectification waveform, the DSC in the PFC device 200 may calculate a corresponding full-wave rectification waveform based on the obtained half-wave rectification waveform.

It should be noted that each bridge arm of the rectifier bridge may be a diode or a switching transistor with a lower turn-on voltage drop, so as to save power consumption.

In a preferred embodiment of the present invention, a circuit structure of the rectifier 203 is not limited to the above-described rectifier bridge. Any circuit that achieves rectification of the AC input signal AC or limits a signal transmission direction of the AC input signal AC may be used as the rectifier 203.

The converter 201 may preferably include a conversion resistor Rs, in which the current to be sensed is a current flowing through the conversion resistor Rs, and the voltage Vut to be sensed is a voltage across the conversion resistor Rs.

It should be noted that, the conversion resistor Rs is an equivalent resistor, that is, the conversion resistor Rs may be one or a plurality of resistors connected in series or in parallel, or may be any impedance device or circuit exhibiting resistance, but is not limited thereto.

The voltage sensor 202 may preferably include an operational amplifier OP, a first resistor R1, a second resistor R2, a third resistor R3 and a feedback resistor R4. A first input terminal (i.e., a negative input terminal) of the operational amplifier OP is coupled with a first terminal of the conversion resistor Rs via the first resistor R1, a second input terminal (i.e., a positive input terminal) of the operational amplifier is coupled with a second terminal of the conversion resistor Rs via the second resistor R2, the second input terminal of the operational amplifier OP is grounded to GND via the third resistor R3, two terminals of the third resistor R3 receive the offset voltage Voffset, the first input terminal of the operational amplifier OP is coupled with an output terminal of the operational amplifier OP via the feedback resistor R4, and an output terminal of the operational amplifier OP outputs the sense voltage Vsense. The offset voltage Voffset may be provided by a constant voltage source 204. In particular, a positive output terminal of the constant voltage source 204 may be coupled with the second input terminal of the operational amplifier OP via the fifth resistor R5, and a negative output terminal of the constant voltage source 204 is grounded.

The voltage sensor 202 defines a reversely proportional amplification circuit with offset. Assuming that its gain is G, an amplitude of the sense voltage Vsense is equal or substantially equal to a sum of a product of the voltage Vut to be sensed and the gain G and the offset voltage Voffset.

It should be noted that the reversely proportional amplification circuit with offset illustrated in FIG. 6 is only an example, and preferred embodiments of the present invention are not limited thereto. The voltage sensor 202 may also be any other circuits which are capable of using the offset voltage Voffset to sense the voltage Vut to be sensed and are not illustrated in detail here.

It should also be noted that the solutions in the preferred embodiments of the present invention are applicable to any type of PFC device and universally applicable. For example, the PFC device may be a PFC device shown in FIGS. 5 and 6, or a Totem Pole PFC device which is not illustrated in detail here.

Figure 7:
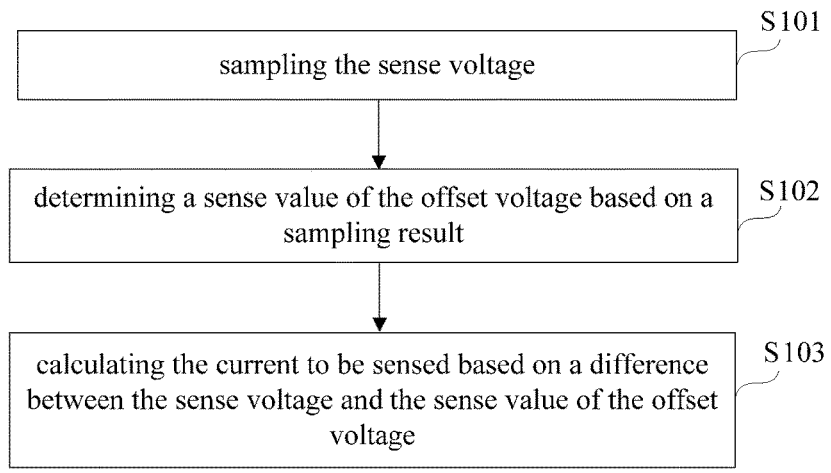
FIG. 7 schematically illustrates a flow chart of a current sensing method for a PFC device according to a preferred embodiment of the present invention.

FIG. 7 schematically illustrates a flow chart of a current sensing method for a PFC device according to a preferred embodiment of the present invention.

Referring to FIGS. 5 to 7, the current sensing method for the PFC device 200 may preferably include:

S101, sampling the sense voltage Vsense;

S102, determining a sense value of the offset voltage Voffset based on a sampling result; and S103, calculating the current to be sensed based on a difference between the sense voltage Vsense and the sense value of the offset voltage Voffset.

As the sense value (other than the nominal value) of the offset voltage Voffset which is obtained by actual sampling is used to calculate the current to be sensed in a preferred embodiment of the present invention, when the offset voltage Voffset fluctuates due to aging of a device, such as a constant voltage source, generating the offset voltage Voffset, a temperature drift or variation of the load resistance RL in the PFC device, the sense value of the offset voltage Voffset may be adjusted based on the sampling result, which effectively improves current sensing accuracy of the PFC device. Further, compared with the existing techniques, preferred embodiments of the present invention do not need to calibrate a PFC device and are easier to implement.

Figure 8:
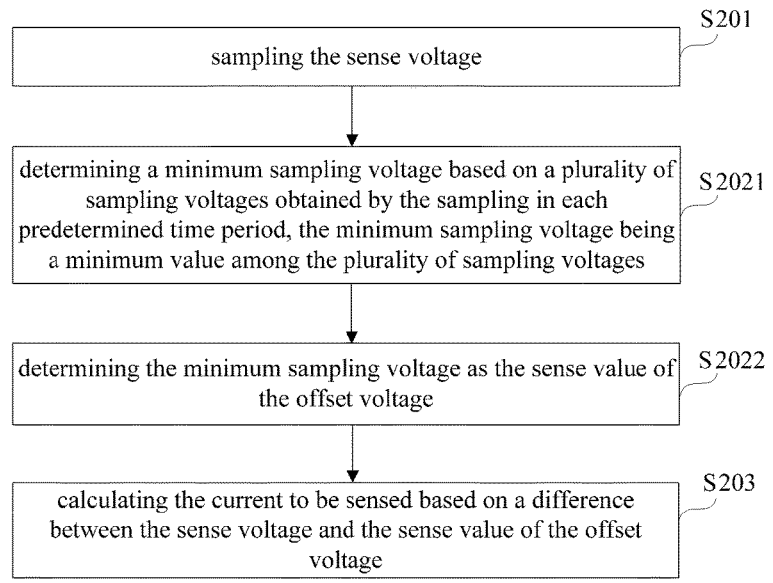
FIG. 8 schematically illustrates a flow chart of a current sensing method for a PFC device according to a preferred embodiment of the present invention.

FIG. 8 schematically illustrates a flow chart of a current sensing method for a PFC device according to a preferred embodiment of the present invention.

Referring to FIGS. 5 to 9, the current sensing method in FIG. 8 for the PFC device 200 may preferably include:

S201, sampling the sense voltage Vsense;

S2021, determining a minimum sampling voltage Smin based on a plurality of sampling voltages S1, S2, S3 to Sn obtained by the sampling in each predetermined time period Tx, the minimum sampling voltage Smin being a minimum value among the plurality of sampling voltages S1, S2, S3 to Sn;

S2022, determining the minimum sampling voltage Smin as the sense value of the offset voltage Voffset; and S203, calculating the current to be sensed based on a difference between the sense voltage Vsense and the sense value of the offset voltage Voffset.

In some preferred embodiments of the present invention, S102 may preferably include S2021 and S2022. As a shift of the sense voltage Vsense is based on the offset voltage Voffset, the minimum sampling voltage Smin is equal or substantially equal to the offset voltage Voffset. The minimum sampling voltage Smin is obtained by calculating a minimum value among the plurality of sampling voltages S1, S2, S3 to Sn obtained by sampling the sense voltage Vsense at a predetermined sampling rate. A timer may be provided to start timing when sampling of the sense voltage Vsense is started until the predetermined time period Tx ends, and then to restart timing, where the sense value of the offset voltage Voffset is updated accordingly at the same time.

In some preferred embodiments of the present invention, the predetermined time period Tx may be determined based on the sampling rate of the sense voltage Vsense and frequency of the AC input signal AC input to the PFC device 200. If the sampling rate is much greater than the frequency of the AC input signal AC, for example, the frequency of the AC input signal AC is about 50 Hz and the sampling rate is about 250 kSps, the predetermined time period Tx may be short, for example, about is to about 2 s. Otherwise, if the sampling rate is low, the predetermined time period Tx needs to be set to be longer.

As the sense value of the offset voltage Voffset used to calculate the current to be sensed is updated every time the predetermined time period Tx elapses, the real-time monitoring of the variation of the offset voltage Voffset is more advantageous to improve the current sensing accuracy of the PFC device 200.

More information about each step shown in FIG. 8 can be referred to a related description of the current sensing method shown in FIG. 7 and are not described in detail here.

Figure 10:
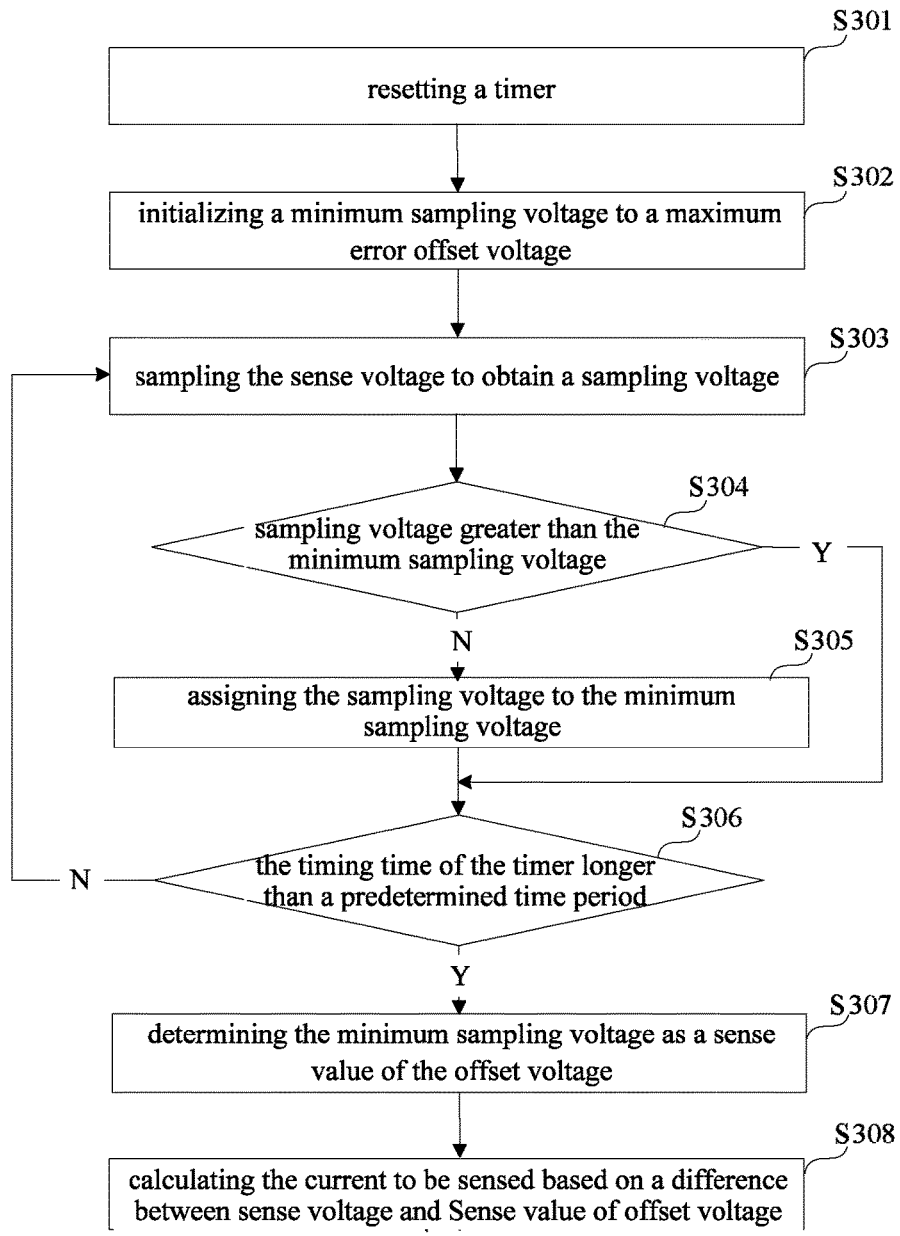
FIG. 10 schematically illustrates a flow chart of a current sensing method for a PFC device in a predetermined time period according to a preferred embodiment of the present invention.

FIG. 10 schematically illustrates a flow chart of a current sensing method for a PFC device in a predetermined time period according to a preferred embodiment of the present invention.

Referring to FIGS. 5 and 8 to 10, the current sensing method in FIG. 10 for the PFC device 200 may preferably include:

S301, resetting a timer and setting a timing time as T1;

S302, initializing a minimum sampling voltage Smin to a maximum error offset voltage, wherein the maximum error offset voltage is a maximum value of the offset voltage Voffset within a predetermined error range;

S303, sampling the sense voltage Vsense to obtain a sampling voltage Sx, wherein x is a positive integer;

S304, determining whether the sampling voltage Sx is greater than the minimum sampling voltage Smin; if not, performing S305, and if yes, performing S306;

S305, assigning the sampling voltage Sx to the minimum sampling voltage Smin;

S306, determining whether the timing time T1 of the timer is longer than a predetermined time period Tx; if no, performing S303 to S305 repeatedly, and if yes, performing S307 and S308 in sequence;

S307, determining the minimum sampling voltage Smin as a sense value of the offset voltage Voffset; and S308, calculating the current to be sensed based on a difference between the sense voltage Vsense and the sense value of the offset voltage Voffset.

In the present preferred embodiment, the monitoring of the predetermined time period Tx is implemented via a timer. Determining the minimum sampling voltage Smin based on the plurality of sampling voltages S1, S2, S3 to Sn obtained by sampling in S2021 shown in FIG. 8 may include S303 to S306 shown in FIG. 10, that is, repeating sampling the sense voltage Vsense to obtain the plurality of sampling voltages S1, S2, S3 to Sn, comparing the plurality of sampling voltages S1, S2, S3 to Sn with the maximum error offset voltage before the predetermined time period Tx ends, and determining a minimum value among the plurality of sampling voltages S1, S2, S3 to Sn and the maximum error offset voltage as the minimum sampling voltage Smin. When the predetermined time period Tx ends, the minimum sampling voltage Smin is determined as the sense value of the offset voltage Voffset, so that the sense value of the offset voltage Voffset is updated based on the minimum sampling voltage Smin, and the current to be sensed is calculated.

It should be noted that the maximum error offset voltage is predetermined, which is the maximum value of the offset voltage Voffset within a predetermined error range and determined based on accuracy of the instrument that generates the offset voltage Voffset. Typically, when the sampling voltage Sx is compared with the maximum error offset voltage, the sampling voltage Sx is smaller than the maximum error offset voltage. However, if an anomaly occurs during the sampling of the sense voltage Vsense which makes the sampling result of the sampling voltage Sx rather large and larger than the maximum error offset voltage, it does not conform to an actual situation. In this case, the maximum error offset voltage as the "minimum value" is directly assigned to the minimum sampling voltage Smin, and determined as the sense value of the offset voltage Voffset, which ensures the accuracy of the current to be sensed under a lowest standard.

In addition, the flow chart shown in FIG. 10 illustrates sensing of current within a predetermined time period Tx. In practice, the above process is continuously repeated. That is, when the timing time T1 of the timer indicates that the predetermined time period Tx ends, the minimum sampling voltage Smin is reset to the maximum error offset voltage, and the timer is reset.

More information about each step shown in FIG. 10 can be referred to a related description of the current sensing methods shown in FIGS. 7 and 8, and are not described in detail here.

Figure 11:
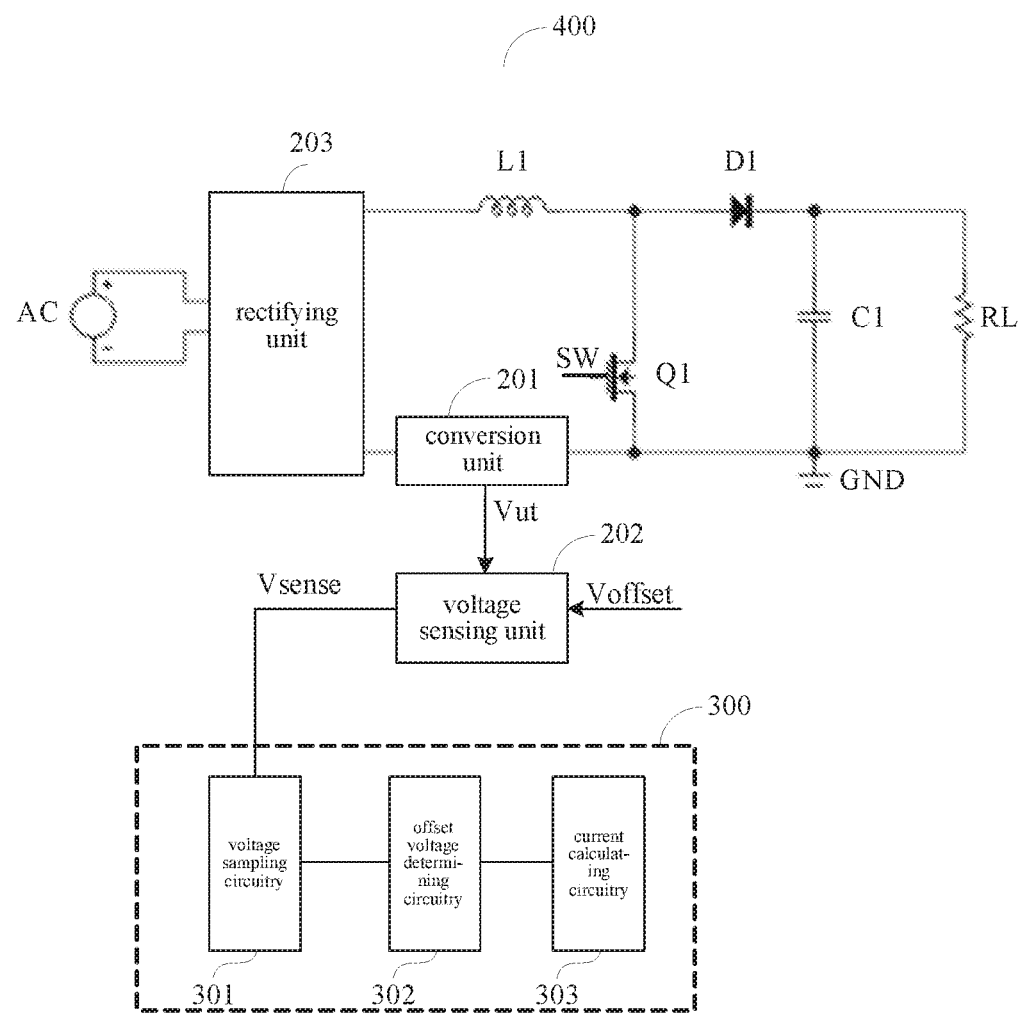
FIG. 11 schematically illustrates a structural diagram of a PFC device according to a preferred embodiment of the present invention.

Preferred embodiments of the present invention further provide a PFC device and current sensing apparatus thereof. FIG. 11 schematically illustrates a structural diagram of the PFC device.

Referring to FIG. 11, a PFC device 400 includes at least one main switch, a converter 201, a voltage sensor 202 and a current sensing apparatus 300 for the PFC device 400. The PFC device 400 shown in FIG. 11 merely includes one main switch as an example, and only the main switch Q1 is used to represent the at least one main switch in the following description. Preferred embodiments of the present disclosure are not limited thereto.

The converter 201 converts the current to be sensed (not shown) in the PFC device 400 into a voltage Vut to be sensed, so as to convert a sensing mode of signals. The voltage sensor 202 receives the voltage Vut to be sensed and the offset voltage Voffset. The voltage sensor 202 senses the voltage Vut to be sensed by using the offset voltage Voffset to output the sense voltage Vsense.

The current sensing apparatus 300 includes a voltage sampling circuitry 301, an offset voltage determining circuitry 302, and a current calculating circuitry 303.

The voltage sampling circuitry 301 samples the sense voltage Vsense, the offset voltage determining circuitry 302 determines a sense value of the offset voltage Voffset based on a sampling result, and the current calculating circuitry 303 calculates the current to be sensed based on a difference between the sense voltage Vsense and the sense value of the offset voltage Voffset.

As the sense value (other than the nominal value) of the offset voltage Voffset which is obtained by actual sampling is used to calculate the current to be sensed in a preferred embodiment of the present invention, when the offset voltage Voffset fluctuates due to aging of a device, such as a constant voltage source, generating the offset voltage Voffset, a temperature drift or variation of the load resistance RL in the PFC device, the sense value of the offset voltage Voffset may be adjusted based on the sampling result, which may effectively improve current sensing accuracy of the PFC device 400.

Figure 12:
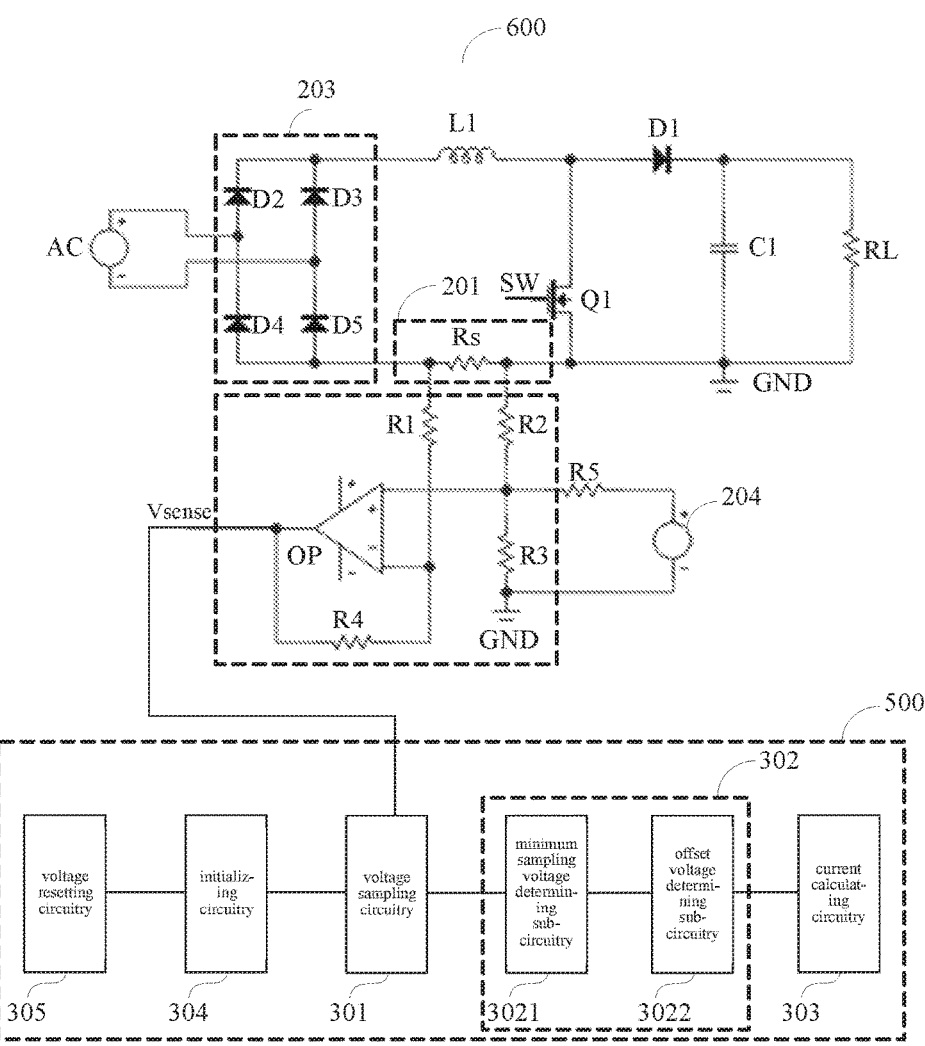
FIG. 12 schematically illustrates a structural diagram of a PFC device according to a preferred embodiment of the present invention.

Preferred embodiments of the present invention provide another PFC device and current sensing apparatus thereof. FIG. 12 schematically illustrates a structural diagram of the PFC device.

Figure 9:
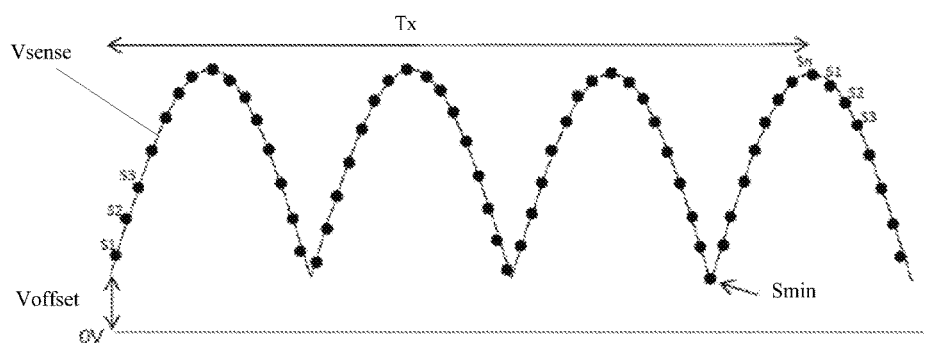
FIG. 9 schematically illustrates a waveform diagram of a sense voltage in a PFC device according to a preferred embodiment of the present invention.

Referring to FIGS. 9, 11 and 12, a PFC device 600 includes at least one main switch, a converter 201, a voltage sensor 202 and a current sensing apparatus 500 for the PFC device 600. More information about the at least one main switch, the converter 201 and the voltage sensor 202 can be referred to a related description above and is not described in detail here.

The current sensing apparatus 500 includes a voltage sampling circuitry 301, an offset voltage determining circuitry 302, and a current calculating circuitry 303.

The offset voltage determining circuitry 302 may preferably include a minimum sampling voltage determining sub-circuitry 3021 and an offset voltage determining sub-circuitry 3022.

The minimum sampling voltage determining sub-circuitry 3021 determines a minimum sampling voltage Smin based on a plurality of sampling voltages S1, S2, S3 to Sn obtained by the sampling in each predetermined time period Tx, the minimum sampling voltage Smin being a minimum value among the plurality of sampling voltages S1, S2, S3 to Sn, and the offset voltage determining sub-circuitry 3022 determines the minimum sampling voltage Smin as the sense value of the offset voltage Voffset.

As a shift of the sense voltage Vsense is based on the offset voltage Voffset, the minimum sampling voltage Smin is equal or substantially equal to the offset voltage Voffset.

Further, as the sense value of the offset voltage Voffset used to calculate the current to be sensed is updated every time the predetermined time period Tx elapses, the real-time monitoring of the variation of the offset voltage Voffset is more advantageous to improve the current sensing accuracy of the PFC device 600.

In some preferred embodiments of the present invention, the current sensing apparatus 500 may preferably further include an initializing circuitry 304, that, before the voltage sampling circuitry 301 samples the sense voltage Vsense, initializes the minimum sampling voltage Smin to a maximum error offset voltage, wherein the maximum error offset voltage is a maximum value of the offset voltage Voffset within a predetermined error range.

The minimum sampling voltage determining sub-circuitry 3021 preferably includes a voltage comparing sub-circuitry (not shown) that is coupled with the initializing circuitry 304 and compares the plurality of sampling voltages S1, S2, S3 to Sn with the maximum error offset voltage, and determines a minimum value among the plurality of sampling voltages S1, S2, S3 to Sn and the maximum error offset voltage as the minimum sampling voltage Smin.

In some preferred embodiments of the present invention, the current sensing apparatus 500 may preferably further include a voltage resetting circuitry 305 coupled with the initializing circuitry 304 that, when the predetermined time period Tx ends, resets the minimum sampling voltage Smin to the maximum error offset voltage.

In the present preferred embodiment, the monitoring of the predetermined time period Tx is implemented via a timer. It should be noted that the maximum error offset voltage is predetermined, which is determined based on accuracy of the instrument that generates the offset voltage Voffset. Typically, the sampling voltage Sx (x is a positive integer) is smaller than the maximum error offset voltage. However, if an anomaly occurs during the sampling of the sense voltage Vsense which makes the sampling result of the sampling voltage Sx larger than the maximum error offset voltage, it does not conform to an actual situation. In this case, the maximum error offset voltage is directly determined as the sense value of the offset voltage Voffset, which ensures the accuracy of the current to be sensed under a lowest standard.

In some preferred embodiments of the present invention, the predetermined time period Tx may preferably be determined based on the sampling rate of the sense voltage Vsense and frequency of the AC input signal AC input to the PFC device 200. If the sampling rate is much greater than the frequency of the AC input signal AC, for example, the frequency of the AC input signal AC is about 50 Hz and the sampling rate is about 250 kSps, the predetermined time period Tx may be short, for example, about is to about 2 s. Otherwise, if the sampling rate is low, the predetermined time period Tx needs to be set to be longer.

In some preferred embodiments of the present invention, the PFC device 600 may preferably further include an inductor L1 and a rectifier 203, wherein the inductor L1 is a power storage inductor which is directly or indirectly coupled with the at least one main switch (i.e., the main switch Q1) and the rectifier 203. The current to be sensed may be an inductor current (not shown) flowing through the inductor L1. The PFC device 600 may further include a freewheeling diode D1 and a capacitor C1.

In some preferred embodiments of the present invention, the rectifier 203 may preferably include a rectifier bridge (not shown in the figures). The rectifier bridge includes a first bridge arm (referring to a second diode D2), a second bridge arm (referring to a third diode D3), a third bridge arm (referring to a fourth diode D4), and a fourth bridge arm (referring to a fifth diode D5), and the first to the fourth bridge arm are sequentially coupled. An anode of the second diode D2 is coupled with a cathode of the fourth diode D4 and a first input terminal of the rectifier bridge, and an anode of the third diode D3 is coupled with a cathode of the fifth diode D5 and a second input terminal of the rectifier bridge, a cathode of the second diode D2 is coupled with a cathode of the third diode D3 and a first output terminal of the rectifier bridge, and an anode of the fourth diode D4 is coupled with an anode of the fifth diode D5 and a second output terminal of the rectifier bridge. The AC input signal AC is provided between the first input terminal and the second input terminal of the rectifier bridge, and the rectifier bridge rectifies the AC input signal AC.

A first terminal of the inductor L1 is directly or indirectly coupled with the first output terminal of the rectifier bridge, and a second terminal of the inductor L1 is directly or indirectly coupled with a first terminal (e.g., the source) of the at least one main switch (i.e., the main switch Q1), a second terminal (e.g., a drain) of the at least one main switch (i.e., the main switch Q1) is directly or indirectly coupled with the second output terminal of the rectifier bridge.

In some preferred embodiments of the present invention, the converter 201 may preferably be disposed in one of the following positions: between the first terminal of the inductor L1 and the first output terminal of the rectifier bridge, between the second terminal of the inductor L1 and the first terminal of the at least one main switch (i.e., the main switch Q1), between the second output terminal of the rectifier bridge and the second terminal of the at least one main switch (i.e., the main switch Q1), or in the first bridge arm, the second bridge arm, the third bridge arm or the fourth bridge arm.

Further, the position of the converter 201 in the PFC device 600 may be changed, so that the solutions are easy to implement and universally applicable.

In some preferred embodiments of the present invention, the converter 201 may preferably include a conversion resistor Rs, where the current to be sensed is a current flowing through the conversion resistor Rs, and the voltage Vut to be sensed is a voltage across the conversion resistor Rs.

In some preferred embodiments of the present invention, the voltage sensor 202 may preferably include an operational amplifier OP, a first resistor R1, a second resistor R2, a third resistor R3, and a feedback resistor R4. A first input terminal (i.e., a negative input terminal) of the operational amplifier OP is coupled with a first terminal of the conversion resistor Rs via the first resistor R1, a second input terminal (i.e., a positive input terminal) of the operational amplifier is coupled with a second terminal of the conversion resistor Rs via the second resistor R2, the second input terminal of the operational amplifier OP is grounded to GND via the third resistor R3, two terminals of the third resistor R3 receive the offset voltage Voffset, the first input terminal of the operational amplifier OP is coupled with an output terminal of the operational amplifier OP via the feedback resistor R4, and an output terminal of the operational amplifier OP outputs the sense voltage Vsense. The offset voltage Voffset may be provided by a constant voltage source 204. In particular, a positive output terminal of the constant voltage source 204 may be coupled with the second input terminal of the operational amplifier OP via the fifth resistor R5, and a negative output terminal of the constant voltage source 204 is grounded.

More information about the current sensing apparatus for the PFC device can be referred to the above description of the current sensing method for the PFC device and is not described in detail here.

It should also be noted that the solutions in the preferred embodiment of the present invention are applicable to any type of PFC device and universally applicable. For example, the PFC device may be a PFC device shown in FIGS. 11 and 12, or a Totem Pole PFC device which is not illustrated in detail here.

Those skilled in the art can understand that all or part of the steps of the various methods in the preferred embodiments of the present invention, and all or part of the features and elements in the corresponding apparatuses, may be implemented by related hardware. For example, the current sensing device 300 or 500 in the preferred embodiments of the present invention may be provided in a chip, and further may be a DSC, a digital signal processor (DSP), a micro controller unit MCU) or other control chips, for example. Preferred embodiments of the present invention are not limited thereto.

The voltage sampling circuitry 301 may be a circuit, a device or an instrument including an analog-to-digital converter (ADC), for example, so as to implement sampling of the sense voltage Vsense. The voltage sampling circuitry 301 may be internally integrated in or externally coupled with the control chip.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A current sensing method for a power factor correction (PFC) device, wherein
   the PFC device includes:
      at least one main switch;
      a converter that converts a current to be sensed in the PFC device into a voltage to be sensed, the PFC device generating a switch control signal to control the at least one main switch based on the current to be sensed; and
      a voltage sensor that receives the voltage to be sensed and an offset voltage, and senses the voltage to be sensed by using the offset voltage to output a sense voltage; and
   the method includes:

sampling the sense voltage;
determining a sense value of the offset voltage based on a sampling result; and
calculating the current to be sensed based on a difference between the sense voltage and the sense value of the offset voltage.

2. The method according to claim 1, wherein determining the sense value of the offset voltage based on the sampling result includes:
determining a minimum sampling voltage based on a plurality of sampling voltages obtained by the sampling in each predetermined time period, the minimum sampling voltage being a minimum value among the plurality of sampling voltages; and
determining the minimum sampling voltage as the sense value of the offset voltage.

3. The method according to claim 2, further comprising:
prior to sampling the sense voltage, initializing the minimum sampling voltage to a maximum error offset voltage, wherein the maximum error offset voltage is a maximum value of the offset voltage within a predetermined error range; wherein
determining the minimum sampling voltage based on the plurality of sampling voltages obtained by the sampling includes:
comparing the plurality of sampling voltages with the maximum error offset voltage; and
determining a minimum value among the plurality of sampling voltages and the maximum error offset voltage as the minimum sampling voltage.

4. The method according to claim 3, further comprising:
when the predetermined time period ends, resetting the minimum sampling voltage to the maximum error offset voltage.

5. The method according to claim 2, wherein the predetermined time period is determined based on a sampling rate at which the sense voltage is sampled and a frequency of an alternating current (AC) input signal input to the PFC device.

6. The method according to claim 1, wherein
the PFC device further includes an inductor and a rectifier; and
the inductor is directly or indirectly coupled with the at least one main switch and the rectifier; and
the current to be sensed is an inductor current flowing through the inductor.

7. The method according to claim 6, wherein
the rectifier includes a rectifier bridge including a first bridge arm, a second bridge arm, a third bridge arm, and a fourth bridge arm, an AC input signal being provided between a first input terminal and a second input terminal of the rectifier bridge, and the rectifier bridge rectifies the AC input signal;
a first terminal of the inductor is directly or indirectly coupled with a first output terminal of the rectifier bridge, a second terminal of the inductor is directly or indirectly coupled with a first terminal of the at least one main switch, and a second terminal of the at least one main switch is directly or indirectly coupled with a second output terminal of the rectifier bridge; and
the converter is disposed at one of the following positions: between the first terminal of the inductor and the first output terminal of the rectifier bridge, between the second terminal of the inductor and the first terminal of the at least one main switch, between the second output terminal of the rectifier bridge and the second terminal of the at least one main switch, or in the first, second, third or fourth bridge arm.

8. The method according to claim 6, wherein the converter includes a conversion resistor, the current to be sensed is a current flowing through the conversion resistor, and the voltage to be sensed is a voltage across the conversion resistor.

9. The method according to claim 8, wherein
the voltage sensor includes an operational amplifier, a first resistor, a second resistor, a third resistor, and a feedback resistor;
a first input terminal of the operational amplifier is coupled to a first terminal of the conversion resistor via the first resistor, a second input terminal of the operational amplifier is coupled to a second terminal of the conversion resistor via the second resistor, the second input terminal of the operational amplifier is grounded via the third resistor, two terminals of the third resistor receive the offset voltage, the first input terminal of the operational amplifier is coupled to an output terminal of the operational amplifier via the feedback resistor, and the output terminal of the operational amplifier outputs the sense voltage.

10. A current sensing apparatus for a power factor correction (PFC) device, wherein the PFC device includes:
at least one main switch;
a converter that converts a current to be sensed in the PFC device into a voltage to be sensed, the PFC device generating a switch control signal to control the at least one main switch based on the current to be sensed; and
a voltage sensor that receives the voltage to be sensed and an offset voltage, and senses the voltage to be sensed by using the offset voltage to output a sense voltage; and
the apparatus includes:
a voltage sampling circuitry that samples the sense voltage;
an offset voltage determining circuitry that determines a sense value of the offset voltage based on a sampling result; and
a current calculating circuitry that calculates the current to be sensed based on a difference between the sense voltage and the sense value of the offset voltage.

11. The apparatus according to claim 10, wherein the offset voltage determining circuitry includes:
a minimum sampling voltage determining sub-circuitry that determines a minimum sampling voltage based on a plurality of sampling voltages obtained by the sampling in each predetermined time period, the minimum sampling voltage being a minimum value among the plurality of sampling voltages; and
an offset voltage determining sub-circuitry that determines the minimum sampling voltage as the sense value of the offset voltage.

12. The apparatus according to claim 11, further comprising:
an initializing circuitry that, before the voltage sampling circuitry samples the sense voltage, initializes the minimum sampling voltage to a maximum error offset voltage, wherein the maximum error offset voltage is a maximum value of the offset voltage within a predetermined error range; wherein
the minimum sampling voltage determining sub-circuitry includes:
a voltage comparing sub-circuitry that is coupled with the initializing circuitry and compares the plurality of sampling voltages with the maximum error offset voltage, and determines a minimum value among the plurality of sampling voltages and the maximum error offset voltage as the minimum sampling voltage.

13. The apparatus according to claim 12, further comprising:
a voltage resetting circuitry that is coupled with the initializing circuitry and, when the predetermined time period ends, resets the minimum sampling voltage to the maximum error offset voltage.

14. The apparatus according to claim 11, wherein the predetermined time period is determined based on a sampling rate at which the sense voltage is sampled and a frequency of an alternating current (AC) input signal input to the PFC device.

15. The apparatus according to claim 10, wherein the PFC device further includes an inductor and a rectifier, the inductor is directly or indirectly coupled with the at least one main switch and the rectifier, and the current to be sensed is an inductor current flowing through the inductor.

16. The apparatus according to claim 15, wherein
the rectifier includes a rectifier bridge including a first bridge arm, a second bridge arm, a third bridge arm, and a fourth bridge arm, an AC input signal being provided between a first input terminal and a second input terminal of the rectifier bridge, and the rectifier bridge rectifies the AC input signal;
a first terminal of the inductor is directly or indirectly coupled with a first output terminal of the rectifier bridge, a second terminal of the inductor is directly or indirectly coupled with a first terminal of the at least one main switch, and a second terminal of the at least one main switch is directly or indirectly coupled with a second output terminal of the rectifier bridge; and
the converter is disposed at one of the following positions: between the first terminal of the inductor and the first output terminal of the rectifier bridge, between the second terminal of the inductor and the first terminal of the at least one main switch, between the second output terminal of the rectifier bridge and the second terminal of the at least one main switch, or in the first, second, third or fourth bridge arm.

17. The apparatus according to claim 15, wherein the converter includes a conversion resistor, the current to be sensed is a current flowing through the conversion resistor, and the voltage to be sensed is a voltage across the conversion resistor.

18. The apparatus according to claim 17, wherein
the voltage sensor includes an operational amplifier, a first resistor, a second resistor, a third resistor, and a feedback resistor; and
a first input terminal of the operational amplifier is coupled to a first terminal of the conversion resistor via the first resistor, a second input terminal of the operational amplifier is coupled to a second terminal of the conversion resistor via the second resistor, the second input terminal of the operational amplifier is grounded via the third resistor, two terminals of the third resistor receive the offset voltage, the first input terminal of the operational amplifier is coupled to an output terminal of the operational amplifier via the feedback resistor, and the output terminal of the operational amplifier outputs the sense voltage.

19. A power factor correction (PFC) device, comprising at least one main switch, a converter, a voltage sensor, and the current sensing apparatus according to claim 10.

* * * * *